United States Patent [19]
Robert

[11] 4,191,955
[45] Mar. 4, 1980

[54] METHOD OF CONTROL FOR AN ANALOG DISPLAY DEVICE OF THE NON-CONTINUOUS LIQUID CRYSTAL STRIP TYPE

[75] Inventor: Jacques Robert, Saint-Egreve, France

[73] Assignee: Commissariat a l'Energie Atomique, Paris, France

[21] Appl. No.: 833,983

[22] Filed: Sep. 16, 1977

[30] Foreign Application Priority Data

Sep. 17, 1976 [FR] France ................................ 76 27982

[51] Int. Cl.² .............................................. G06F 3/14
[52] U.S. Cl. ................................ 340/753; 340/805; 340/765; 340/784
[58] Field of Search ........................ 350/330, 331, 333; 340/324 M, 336, 805, 753, 765, 784

[56] References Cited
U.S. PATENT DOCUMENTS

| | | | |
|---|---|---|---|
| 3,936,676 | 2/1976 | Fujita | 340/336 |
| 3,949,242 | 4/1976 | Hirasawa et al. | 340/336 |
| 4,048,633 | 9/1977 | Sano | 340/784 |
| 4,054,385 | 10/1977 | Wheable | 350/333 |
| 4,060,801 | 11/1977 | Stein et al. | 350/333 |
| 4,060,802 | 11/1977 | Matsuki | 350/333 |

*Primary Examiner*—Marshall M. Curtis
*Attorney, Agent, or Firm*—Cameron, Kerkam, Sutton, Stowell & Stowell

[57] ABSTRACT

A liquid crystal film placed between plate electrodes and point electrodes can have a first optical state 1 if the electrical excitation applied between the plate and point electrodes is higher than a threshold value $V_s$ and a second optical state 0 of this excitation is lower than the threshold value. A set of P voltages is applied to the P point connections of the device and a second set of S voltages is applied simultaneously to the S sector connections. In a boundary sector, some points of the liquid crystal are thus in state 1 while other points are in state 0. In the case of each of the other sectors, the points of any one sector are all in one of the two states 1 or 0.

7 Claims, 9 Drawing Figures

METHOD OF CONTROL FOR AN ANALOG DISPLAY DEVICE OF THE NON-CONTINUOUS LIQUID CRYSTAL STRIP TYPE

BACKGROUND OF THE INVENTION

This invention relates to a method of control for an analog display device of the non-continuous liquid crystal strip type and to a circuit for the practical application of said method. The invention finds an application in the field of electro-optics and especially in the display of physical quantities such as voltage, temperature, velocity, time and so forth.

A known type of liquid crystal analog display device is constituted by a strip of liquid crystal film interposed between two sets of electrodes. Under excitation, a device of this type can assume, for example, a first optical state on one portion of the strip and a second state on the remainder of the strip. The length of one of these portions constitutes an analog representation of a physical quantity.

In some cases these display devices have a continuous character since the electrodes chosen are continuous strips. One known device which can be mentioned by way of example and falls in this class consists of a conductive electrode and a resistive electrode placed in oppositely-facing relation. A device of this type is described in particular in the article by R. A. Soref, entitled "Electronically Scanned Analog Liquid Crystal Displays" and published in the June, 1970 issue of "Applied Optics", vol. 9, No 6, page 1323.

In other devices, the electrodes have a noncontinuous structure. These devices are constituted by a plurality of juxtaposed electrodes of small size. The display operation is again performed by means of the length of a strip but is subject in this case to non-continuous variation. A device of this type is described, for example, in the article by W. L. Carl and C. R. Stein entitled "A Non-scanning Matrix Addressing Scheme for Certain Liquid Crystal Displays", published in the reports on the symposium of the Society for Information Display (SID) held in 1976 at Beverley Hills, Chapter 4.4, page 40, and in the article by S. Sherr entitled "A Liquid Crystal Bar Graph Meter" and published in the same reports, Chapter 4.5, page 42.

The control of liquid crystal display devices formed by a plurality of excitation points gives rise to particular problems. It would of course be possible to control each point of the liquid crystal strip separately. This method would lead to a very high degree of complexity of the connection system since the number of connections would have to be equivalent to the number of elements to be controlled.

For the reason just stated, it is usually found preferable to group the different points together in sectors. Control of the display at one point is accordingly split up into control of a sector and control of a point of a predetermined order. If the entire strip of a display system consists of N points, said strip is therefore split up into S sectors of P points with S.P.=N. In practice, this consists in providing electrodes in the form of S plate-type electrodes, there being placed opposite to these latter P point-type electrodes. According to its order, each point electrode is joined to one particular connection of a group of P point connections and each plate electrode is joined to one particular connection of a group of S plate connections. The total number of connections is thus reduced from S×P to S+P.

Control of the analog display of a physical quantity by means of a device of this type is carried out by applying a first set of voltages to the S plate connections and a second set of voltages to the P point connections. This particular structure and the resultant method of control recall the matrix structures of certain crossbar display devices in which the display is carried out by applying voltages to the columns and to the lines of the matrix.

As in the case of the matrix structure, control of the single-strip device can be sequential if excitation signals are applied sequentially to the plate electrodes or else it can be non-sequential if the control voltages are applied simultaneously to all the plates.

However, analog display along a strip has specific characters which are not found in matrix devices. In point of fact, the display of a strip of variable length makes it necessary for the different sectors of the strip to be of two types: in the case of all sectors except one, the displayed points all have the same optical state (either 1 or 0); in the case of only one of the sectors the points have in some cases the state 1 and in other cases the state 0. This special sector will be designated hereafter as a boundary sector and determines the position of the zone of transition between that portion of the strip which is in state 1 and the remainder of the strip which is in state 0. A logical system of this type is not usually present in matrix devices since the display of a matrix in which all the strips except one are either in state 1 or in state 0 would be of no practical interest.

The methods of control for strip-type analog display devices therefore have distinctive characters. In the first place, they must ensure that the voltages applied to the point electrodes and to the plate electrode of the boundary electrode correctly initiate the appearance of the two possible states in this boundary sector. In the second place, they must ensure that the voltages which inevitably appear on the other point electrodes of the other sectors (by reason of the interconnection of the point electrodes) result in correct display on the other sectors, that is, a uniform display either in state 1 or in state 0.

In order to solve this problem, it has been proposed, especially in the aforementioned article by W. L. Carl and C. R. Stein, to carry out the discrimination between displayed points and non-displayed points by means of the excitation frequency. In more exact terms, the following procedure is adopted for controlling the boundary sector. An a.c. voltage having a frequency $f_0$ is applied to the plate electrode whilst an a.c. voltage having the same frequency $f_0$ and the same amplitude as the preceding is applied to the point electrodes of said boundary sector; the last-mentioned voltage has the same phase if it is desired to display the state 0 and is in opposite phase it it is desired to display the state 1.

A voltage having a frequency which is higher than the cut-off frequency of the liquid crystal is applied to the plate electrodes located on one side of the boundary sector in which it is desired to obtain a uniform appearance corresponding to the state 0. By way of example, said frequency has a value of 20 $f_0$. The voltages applied to the point electrodes of these sectors remain the same as those applied to the point electrodes of the boundary sector since the point electrodes are interconnected. The high-frequency voltage applied to the flat electrode imposes an optical state 0 on the liquid crystal irrespective of the phase of the voltage applied to the point electrodes. The contrast obtained in this zone which is located on one side of the boundary sector is accordingly uniform.

Control of the sectors located on the other side of the boundary sector is carried out by applying to the plate electrodes of these sectors a voltage having a frequency $2 f_0$ and an amplitude equal to 1.73 times the amplitude applied to the point electrodes. In consequence and irrespective of the phase of the voltages applied to the point electrodes, all the points of said sectors are excited in the same manner and are in the optical state 1.

This method of control is therefore of considerable complexity since it entails the use of signals having three different frequencies: $f_0$, $2 f_0$ and $20 f_0$. Moreover, the method presupposes the existence of a cut-off frequency at which the dielectric anisotropy of the liquid crystal undergoes a change of sign and is therefore not applicable to all liquid crystals.

SUMMARY OF THE INVENTION

The present invention is precisely directed to a method of control for devices of this type, this method being much more straightforward than the method mentioned above in connection with the prior art. Both the theoretical and experimental researches conducted by the present Applicant have shown that it was not necessary to employ a frequency discrimination in order to distinguish the displayed zones 1 or 0 but that it proved feasible and much more simple to modify the amplitude of the excitations. The present Applicant has found that, in spite of the differences in excitations applied to the different points of any one sector, the appearance obtained by means of an amplitude discrimination was wholly satisfactory in regard to uniformity of contrast and that any fears which may have been entertained in this respect were consequently groundless.

The method of control in accordance with the present invention is therefore based on an amplitude discrimination.

In more precise terms, the invention is therefore concerned with a method of control for an analog display device constituted by a band of liquid crystal along which is displayed a strip having a length which is a function of the value of a physical quantity to be displayed. Said strip is non-continuous and formed by S sectors each consisting of P points. Each sector comprises a plate electrode connected to a sector connection and placed opposite to P point electrodes connected to a set P of point connections. The liquid crystal which is interposed between the plate electrodes and the point electrodes can have a first optical state 1 if the electrical excitation applied between the plate and point electrodes is higher than a threshold value $V_s$ and a second optical state 0 if this excitation is lower than said threshold value. The method is of the type in which a set of P voltages is applied to the P point connections of the device and a second set of S voltages is applied simultaneously to the S sector connections. These sets of voltages are such that, in the case of one of the sectors referred-to as a boundary sector, some points of the liquid crystal are in state 1 and other points are in state 0 and such that, in the case of each of the other sectors, the points of any one sector are all in one of the two states 1 or 0. Said method is distinguished by the fact that:

a voltage $V_1$ is applied to the plate connection of the boundary sector, a voltage $V_2$ is applied to the point connections which are joined to the point electrodes of the boundary sector in which a state 0 must be displayed, this voltage being such that the resultant excitation $V_1 - V_2$ at said points is lower than or equal to the threshold value $V_s$, a voltage $-V_2'$ is applied to the point connections which are joined to the point electrodes of the boundary sector in which a state 1 must be displayed, this voltage being such that the resultant excitation $V_1 - V_2'$ at said points is higher than the threshold value, a voltage $V_3$ is applied to the plate connections of the sectors in which all the points must be in state 1, this voltage being of sufficiently high value to ensure that the two resultant excitations $(V_3 - V_2)$ and $(V_3 + V_2')$ at the different points of said sectors are both higher than the threshold value, a voltage $V_4$ is applied to the plate connections of the sectors in which the points must be in state 0, this voltage being of sufficiently low value to ensure that the resultant excitations $(V_4 - V_2)$ and $(V_4 + V_2')$ are both lower than the threshold value, all the applied voltages have the same frequency.

Preferably, the voltage $V_1$ which is applied to the plate of the boundary sector has a value which is slightly higher than the threshold value $V_s$. For example, the voltage $V_1$ is equal to $2 V_s$. The voltages $V_2$ and $V_2'$ applied to the point electrodes are in that case preferably equal in modulus to the threshold voltage ($V_s$ or $-V_s$). The excitation in the boundary sector is in that case $2 V_s + V_s = 3 V_s$ in the case of the points which are intended to have a state 1 and $2 V_s - V_s = V_s$ in the case of the points which are intended to have a state 0.

Especially in the particular case considered in the foregoing, it is also preferably ensured that the voltage $V_3$ applied to the plate electrodes of the sectors in which all the points must be in state 1 has a value which is higher than $3 V_s$ and equal for example to $4 V_s$. In these sectors, the combination of these two preferential arrangements therefore results in excitations which are either equal to $4 V_s - V_s = 3 V_s$ or equal to $4 V_s + V_s = 5 V_s$. Both these voltages are very substantially higher than the threshold value and, in actual fact, therefore result in the desired state 1.

The value of the voltage $V_4$ applied to the plate electrodes of the sectors in which all the points must be in state 0 is preferably considerably lower than the threshold value and is, for example, zero. The excitations which appear in these sectors are therefore equal to $+V_s$, or to $-V_s$, which is insufficient in both cases to obtain the state 1.

It is clearly always possible to add a fixed voltage to these special voltages but this only results in displacing all the voltages without modifying their difference, that is to say without modifying the excitation imposed on the liquid crystal.

In the definitions given in the foregoing, the applied voltages can be d.c. voltages but are preferably low-frequency a.c. voltages having a zero mean value. They can take the form of sine-wave signals or rectangular signals. In this case, the voltage designated as $-V_2'$ is obtained as a result of a phase-shift of the voltage $+V_2'$ through 180°. It is also possible to employ voltages which are phase-shifted with respect to each other since the discrimination is not carried out on the voltages proper which are applied to the electrodes but on the effective value of the differences with respect to each other.

It is also an advantage to superimpose a high-frequency voltage on the low-frequency excitation voltages at all points of the device, thereby enhancing uniformity of contrast. This high frequency does not play the same part as in the prior art mentioned earlier since it is uniformly applied to all the electrodes and therefore does not make it possible to effect a discrimination.

BRIEF DESCRIPTION OF THE ACCOMPANYING DRAWINGS

The distinctive features and advantages of the invention will in any case become more readily apparent from the following description of exemplified embodiments which are given by way of explanation without any limitation being implied, reference being made to the accompanying drawings, wherein.

DESCRIPTION OF PREFERRED EMBODIMENT

Figure 1:
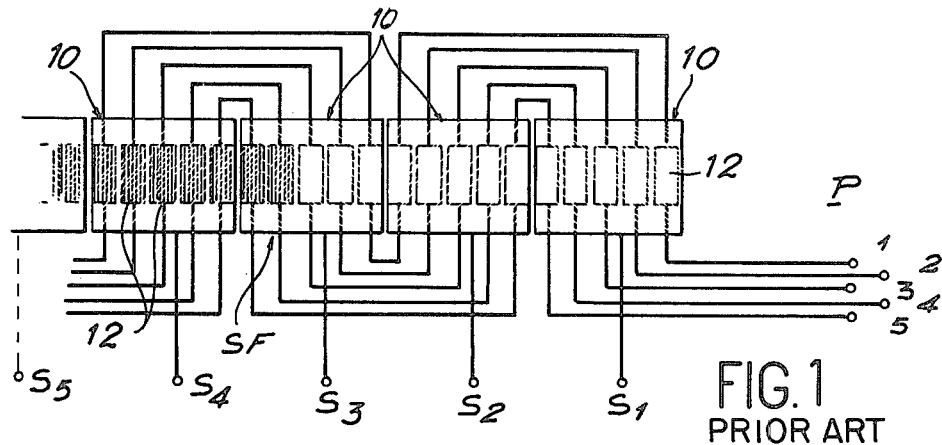
FIG. 1 is a schematic representation of the structure of a non-continuous analog display device in accordance with the present invention.

FIG. 1 shows diagrammatically the structure of the electrodes in a strip-type display device. This structure is known per se, especially as disclosed in the aforementioned article by S. Sherr. The entire group of display points is split up into sectors. Four sectors each having five points are shown by way of explanation in FIG. 1.

The two families of electrodes designed to obtain a structure of this type are constituted in one case by plate electrodes 10 and in the other case by point electrodes 12. The plate electrode 10 of each sector is joined to a sector connection designated respectively by the references $S_1$, $S_2$, $S_3$, $S_4$; the point electrodes are joined to point connections designated respectively by the references $P_1$, $P_2$, $P_3$, $P_4$, $P_5$.

The point electrodes are joined to each other by means of conductive connections. In the device shown in the figure, the first point electrode of one sector is connected to the last point electrode of the adjacent sector whilst the second point electrode is connected to the next to last point electrode of the adjacent sector and so forth. This particular system of connection offers the advantage of preventing intercrossing of wires and can readily be obtained by photoetching. It will readily be understood that other systems of connection can be contemplated if intercrossing of the connections is found to be acceptable (e.g. multilayer systems).

Figure 2:
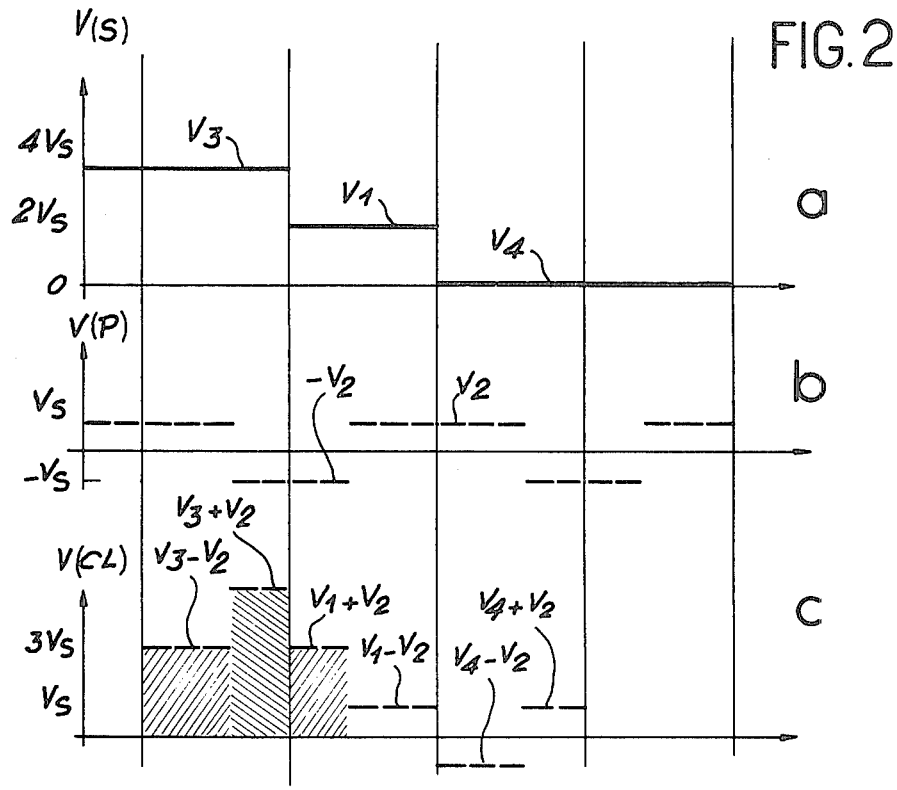
FIG. 2 represents the voltages applied to the different electrodes of the device.

In order to control the device shown in FIG. 1 with a view to initiating the appearance of the optical state 1 on a predetermined portion of the strip, the procedure in accordance with the invention consists in applying voltages $V_1$, $V_2$, $V_2'$, $V_3$ and $V_4$, the values of which are shown in FIG. 2. V(S) designates the voltage applied to the plate electrodes of the sectors, V(P) designates the voltage applied to the point electrodes and V(CL) designates the resultant excitation in the case of the liquid crystal.

This figure corresponds to the particular case already mentioned in which the voltage $V_1$ applied to the plate connection of the boundary sector designated by the reference SF is equal to 2 VS whilst the voltage $V_3$ is equal to 4 VS and the voltage $V_4$ is equal to 0. In order to cause the appearance of the black strip of FIG. 1, a voltage equal to $V_s$ is applied to the first three point electrodes of the boundary sector and a voltage $-V_s$ is applied to the last two point electrodes.

The excitation V(CL) of the liquid crystal which is interposed between the plate electrode of the boundary sector and the first three point electrodes of said sector is therefore equal to 2 $V_s - V_s = V_s$ whereas this excitation at the other two point electrodes is equal to 2 $V_s + V_s = 3 V_s$. The first three points of the boundary sector therefore have the optical state 0 and the other two points have the optical state 1.

As a result of the conductive connections established between the different point electrodes, the voltages $+V_s$ and $-V_s$ also appear on the point electrodes of sectors other than the boundary sector. In order to obtain the optical state 1 on all points of the sectors located on the left of the boundary sector, a voltage 4 $V_s$ is applied in accordance with the invention. The two excitations 4 $V_s + V_s = 5 V_s$ and 4 $V_s - V_s = 3 V_s$ which result therefrom on the different points of the sectors located on the left of the boundary sector are both higher than the excitation threshold value.

Conversely, in order to obtain an optical state 0 on all the points of the sectors located on the right of the boundary sector SF, a zero voltage $V_4$ is applied in accordance with the invention, with the result that the resultant excitations $0 - V_s = -V_s$ and $0 + V_s = V_s$ do not exceed the excitation threshold value $V_s$.

It is observed from FIG. 2 that the excitations V(CL) are not uniform in the sectors other than the boundary sector. In particular, two different excitations 5 $V_s$ and 3 $V_s$ are present in the sector which is located directly to the left of the boundary sector. In consequence, it could reasonably be expected that a sector of this type does not have a uniform appearance and that the contrast obtained in the case of the first two points (in which the excitation is equal to 5 $V_s$) is sharper than that of the three following points (in which the excitation is only 3 $V_s$). In point of fact, the researches made by the present Applicant have brought out a surprising phenomenon in which the contrast obtained under these conditions exhibits satisfactory uniformity. This effect can be interpreted with the aid of FIGS. 3 and 4.

Figure 3:
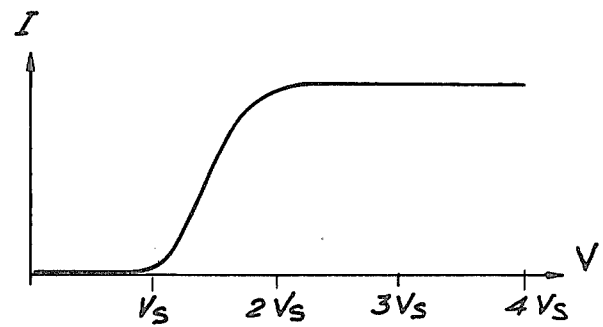
FIG. 3 represents the variation in contrast at one point of the liquid crystal as a function of the electrical excitation applied thereto.

FIG. 3 represents the variation in contrast I at one point of the liquid crystal as a function of the applied excitation which is plotted as abscissae and expressed with respect to the $V_s$ threshold excitation. This curve shows that the contrast is zero as long as the excitation is lower than the value $V_s$ and that this contrast attains a saturation value as soon as the excitation attains the value 2 $V_s$.

Figure 4:
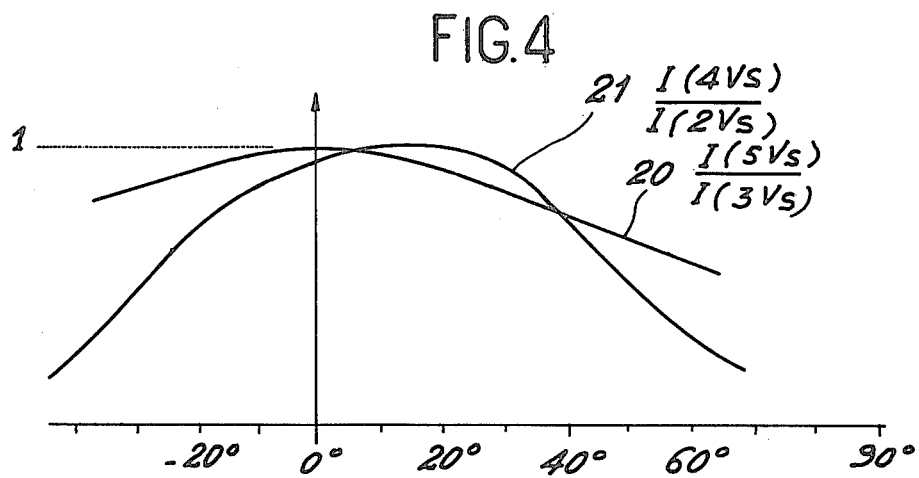
FIG. 4 represents curves of variation of the ratio between the contrasts obtained in respect of two different excitations of 2 $V_s$ as a function of the angle of view.

This curve corresponds to the case in which the observation is made at right angles to the liquid crystal film. In the case of an oblique observation, the law of variation in contrast is dependent on the angle of view. FIG. 4 precisely represents the curves which take the angle of view into account.

This figure shows the curve of variation in the ratio between the contrasts obtained on the one hand with an excitation which is equal to 5 $V_s$ and on the other hand with an excitation which is equal to 3 $V_s$ (the curve designated by the reference 20) as a function of the angle of view. Another curve 21 is indicated and this latter shows the variation in the ratio between the contrasts obtained with an excitation which is equal to 4 $V_s$ and to 2 $V_s$.

These curves show that, if the angle of view does not exceed about forty degrees, the contrasts obtained in respect of excitations equal to 5 $V_s$ and 3 $V_s$ differ by less than 20%. This means that the points displayed in the sectors located to the left of the boundary sector shown in FIG. 1 will all exhibit practically the same contrast (to within 20%).

This is the surprising result to which the researches conducted by the present Applicant have finally led. This explains why it proves unnecessary to base the discrimination between displayed and non-displayed points on a difference in frequency since it is only necessary to modify the amplitude of the excitations.

As indicated by the curve 22 of FIG. 4, this result is equally valid in the case of the pair of excitations having the value of 4 $V_s$ and 2 $V_s$, which means that the particular values 5 $V_s$ and 3 $V_s$ which are chosen are not critical. From this it follows that it would be possible to employ a voltage equal to 3 $V_s$ (instead of 4 $V_s$) as a voltage $V_3$, which would result in excitations equal to 4 $V_s$ and 2 $V_s$ in respect of the sectors displayed. In this case, the contrasts obtained in regard to these two excitations are still very close to each other as long as the angle of view does not exceed 40°, which is often the case in practice.

Figure 5:
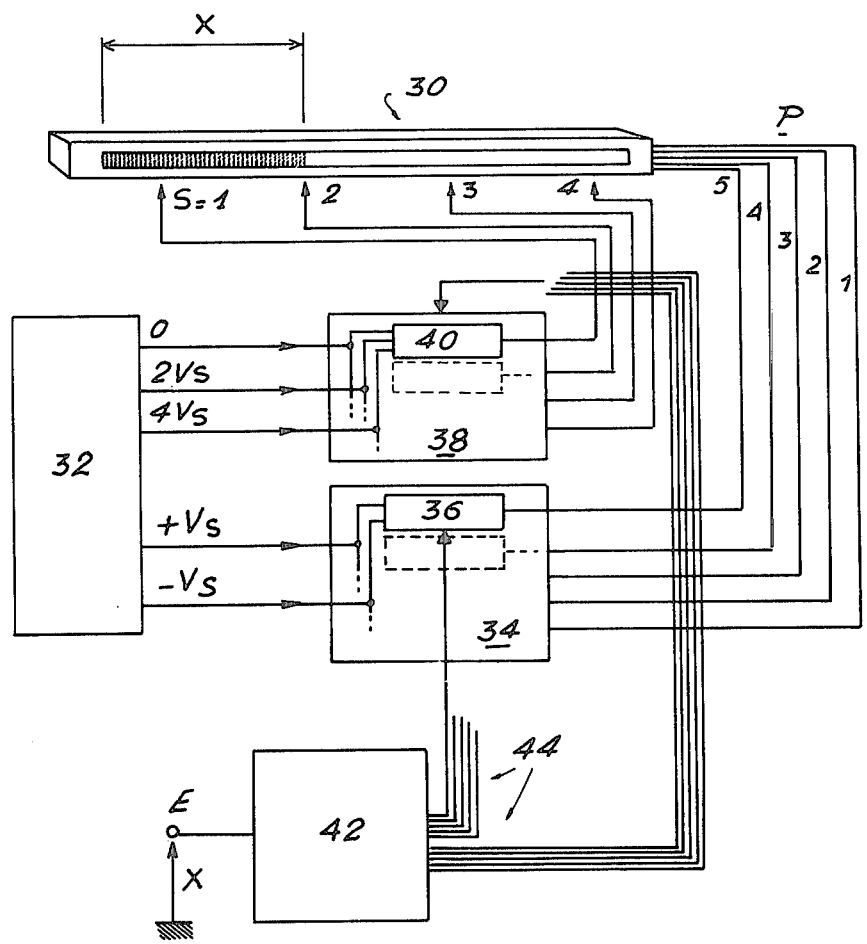
FIG. 5 is a block diagram of the circuit for carrying out the method in accordance with the invention.

FIG. 5 is a block diagram showing the means for carrying out the method described in the foregoing. These means are applied to the control of the device 30 which has P point connections and S sector connections and they essentially comprise:

a circuit 32 for delivering the voltages which are necessary for excitation of the liquid crystal; by way of example, these voltages are 0, 2 $V_s$, 4 $V_s$, +$V_s$ and −$V_s$;

an addressing circuit 34, the P outputs of which are connected to the P point connections of the device 30 and the two inputs of which receive voltages $V_s$ and −$V_s$; this circuit 34 comprises P switching circuits 36;

a second addressing circuit 38, the S outputs of which are connected to the S sector connections of the device 30 and the three inputs of which receive the voltages 0, 2 $V_s$ and 4 $V_s$; this circuit 38 comprises S switching circuits 40.

The group of P switching circuits 36 of the first addressing circuit 34 and the group of S switching circuits 40 of the second addressing circuit 38 are controlled by a decoding circuit 42 and the physical quantity X to be displayed is applied to the input E of this latter. Said decoder 42 converts the quantity X into logical signals transmitted by connections which permit correct addressing of voltages. The decoder 42 is not described herein since it does not form part of the invention and is well-known to anyone versed in the art.

Figure 6:
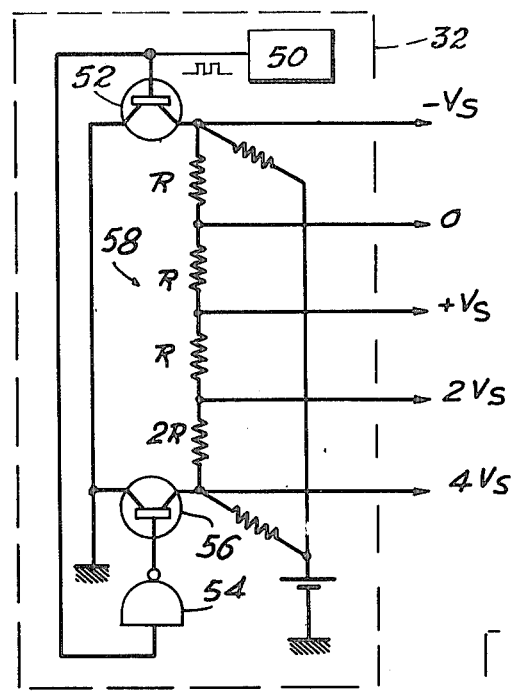
FIG. 6 is a diagram of a circuit for delivering the necessary control voltages.

FIG. 6 is a diagram of a circuit for delivering the voltages which are necessary for the control of the device 30. Said circuit comprises a generator 50 for producing rectangular signals which are applied on the one hand to a transistor 52 and on the other hand to a second transistor 56 after inversion by the inverter gate 54. The voltages collected at different points of a resistor bridge 58 constitute the voltages 0, ±$V_s$, 2 $V_s$ and 4 $V_s$ which are necessary for the control of the device 30.

Figure 7:
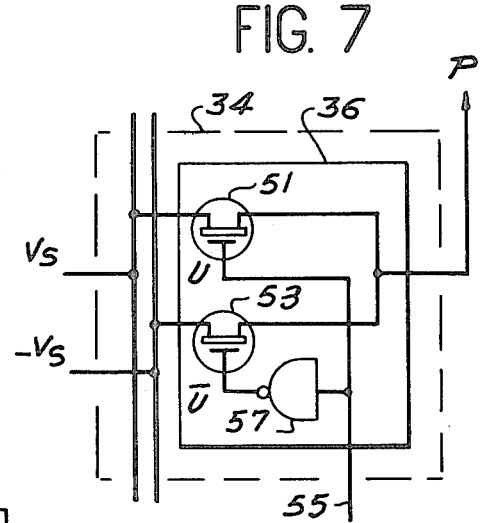
FIG. 7 is a diagram of a circuit for addressing the point electrode control voltages.

FIG. 7 is a diagram of a circuit for switching the point control voltages of the circuit 36 shown in FIG. 6. This circuit is constituted by two field-effect transistors 51 and 53 controlled by a signal u which is carried by the lead 55 and inverted by the inverter gate 57. There appears on the output lead P a voltage which is equal to +$V_s$ or to −$V_s$ depending on the value of the control voltage u.

Figure 8:
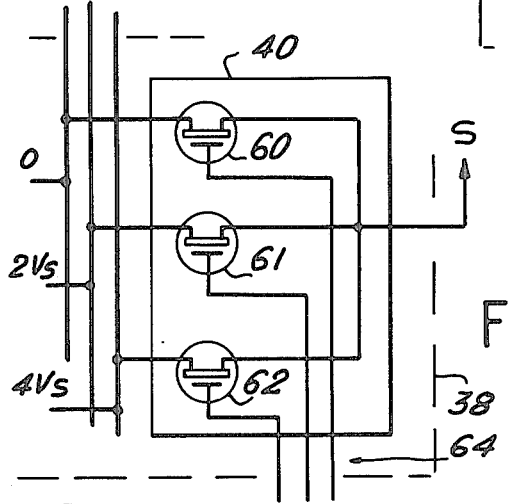
FIG. 8 is a diagram of a circuit for addressing the sector control voltages.

FIG. 8 is a diagram of a circuit for switching the sector control voltages (circuit 40 of FIG. 5). This circuit is constituted by field-effect transistors 60, 61 and 62 to which the voltages 0, 2 $V_s$ and 4 $V_s$ are applied respectively. The signals for initiating conduction of said transistors are carried by the leads 64 and make it possible to apply one of these three voltages to the output lead S which is connected to the plate of a sector.

It is apparent from the foregoing that the control circuit for carrying out the method in accordance with the invention offers many advantages, viz:

those of multiplexed systems since said control circuit makes it possible to reduce the number of connections to S+P in the case of a device comprising S.P. display points, those of non-multiplexed systems and in particular a simple electronic control system, correct performances (good contrast and a good angle of view); the control circuit also permits the use of low control voltages and consequently results in low power consumption.

In the foregoing description, the excitation voltages applied to the electrodes are d.c. voltages or low-frequency a.c. voltages. In accordance with one advantageous embodiment, a high-frequency voltage can be superimposed on these voltages, thus having the effect of improving the uniformity of contrast and of reducing the switching time.

Figure 9:
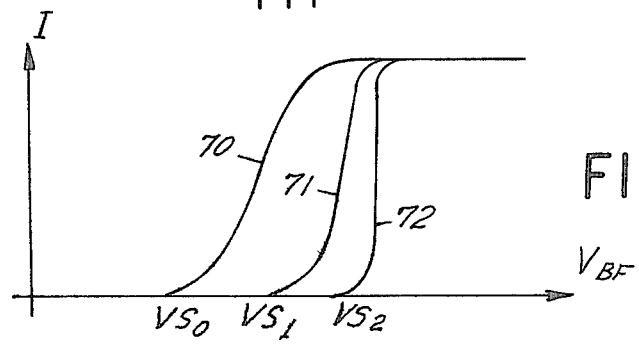
FIG. 9 illustrates the influence of a high-frequency voltage superimposed on the low-frequency excitation voltages.

The effect of this superimposition is illustrated in FIG. 9 which represents the curve of variations in contrast I as a function of the low-frequency voltage. The curve 70 corresponds to the case in which there is no applied high-frequency; this curve is identical with that of FIG. 3. The curves 71 and 72 correspond to increasing high-frequency voltages; they illustrate the increase in the threshold voltage with the applied high frequency and the increase in slope of the transition zone. Said curves also show that the saturation zone is attained very quickly as soon as the threshold has been overstepped and therefore that the excitations which are equivalent to 3 $V_s$ and 5 $V_s$ retain an identical optical appearance even in respect of wide angles of observation. The contrast is modified in the case of voltages located in the vicinity of the threshold since the variation in contrast becomes much more rapid in this zone (see curve 72). The discrimination between displayed points and nondisplayed points is accordingly facilitated.

Although the applied voltages in accordance with the present invention have the same frequency, they do not necessarily have the same phase. It may even be advantageous in some cases to modify the phase-shift between applied voltages in order to obtain an excitation of suitable intensity.

The liquid crystal employed in the device hereinabove described is advantageously a twisted nematic interposed between an analyzer and a polarizer. This structure can be obtained for example with a cyanobiphenyl or a eutectic mixture of a number of cyanobiphenyls or with ZLI518 manufactured by Merck. In the last-mentioned case, the applied low-frequency signals can be at 2 kc/s, for example; if a high-frequency voltage is superimposed on these signals, the low frequency can be in the vicinity of 50 kc/s.

The surface treatment which is given to the electrodes in order to endow these latter with the property of suitably orienting the long axes of the liquid crystal molecules is already known and can accordingly consist of rubbing, of oblique deposition of a substance such as silicon oxide, of dipping in a surfactant and so forth.

It is worthy of note that the invention can be employed in conjunction with the invention which formed the subject of French patent Application No EN 7517050 of May 30, 1975. The applied voltages accordingly result from the superimposition of two frequencies located on each side of the cutoff frequency of a liquid crystal (namely the frequency at which the dielectric anisotropy changes sign). A device of this type has a short image-changing time.

In this alternative embodiment, there can be applied to the points a high-frequency voltage (above the cut-off frequency at which the dielectric anisotropy of the liquid crystal assumes the value $\epsilon_2$) and there can be applied to the plates a low-frequency voltage (below the cut-off frequency at which the anisotropy assumes the value $\epsilon_1$ of contrary sign) which may be superimposed on a high-frequency voltage if necessary. The preceding notations being again adopted, a low-frequency voltage $V_{1BF}$ superimposed on a high-frequency voltage $V_{1HF}$ can thus be applied for example to the plate of the boundary sector and a voltage $V_{2HF}$ or $-V_{2HF}$ can be applied to the points of said sector; a low-frequency voltage can be applied to the plate of the adjacent sectors in state 1; a low-frequency $V_{4BF}$ superimposed on a high-frequency voltage $V_{4HF}$ can be applied to the plate of the sectors in state 0.

There are therefore obtained the following excitations:

on the sectors which are uniformly in state "1":

$$\epsilon_1 V^2_{3BF} - \epsilon_2 V^2_{2HF} \quad (1)$$

on the boundary sector:

state 1: $\epsilon_1 V^2_{1BF} - \epsilon_2 (V_{1HF} - V_{2HF})^2 \quad (2)$ state 0: $\epsilon_1 V^2_{1BF} - \epsilon_2 (V_{1HF} + V_{2HF})^2 \quad (3)$ on the sectors which are uniformly in state "0":

$$\epsilon_1 V^2_{4BF} - \epsilon_2 (V_{4HF} - V_{2HF})^2 \quad (4)$$

$$\epsilon_1 V^2_{4BF} - \epsilon_2 (V_{4HF} + V_{4BF})^2 \quad (5)$$

Should it be desired to ensure that all the excited points are in the same state resulting from an excitation which is equivalent to 3 $V_s$, the voltages chosen will be such that the following conditions arising from (1) and (2) are satisfied:

$$\epsilon_1 V^2_{3BF} V^2 - \epsilon_2 V^2_{2HF} V^2 = \epsilon_1 9 V_s^2 V^2$$

hence $$V^2_{3BF} = 9V_s^2 + \frac{\epsilon_2}{\epsilon_1} V^2_{2HF} \quad (1')$$

and $$\epsilon_1 V^2_{1BF} - \epsilon_2 (V_{1HF} - V_{2HF})^2 = \epsilon_1 9 V_s^2$$

hence $$V^2_{1BF} = 9V_s^2 + \frac{\epsilon_2}{\epsilon_1} (V_{1HF} - V_{2HF})^2 \quad (2')$$

Should it be desired in addition to ensure that all the non-excited positions correspond to the same zero or negative excitation, the voltages chosen will be such that the following conditions arising from Expressions 3 and 4 are satisfied:

$$\epsilon_1 V^2_{1BF} - \epsilon_2 (V_{1HF} + V_{2HF})^2 \leq 0$$

hence $$V^2_{1BF} \leq \frac{\epsilon_2}{\epsilon_1} (V_{1HF} + V_{2HF})^2 \quad (3')$$

and $$\epsilon_1 V^2_{4BF} - \epsilon_2 (V_{4HF} - V_{2HF})^2 \leq 0$$

hence $$V^2_{4BF} \leq \frac{\epsilon_2}{\epsilon_1} (V_{4HF} - V_{2HF})^2 \quad (4')$$

It will be noted that if equation (4') is satisfied, equation (5')

$$V^2_{4BF} \leq \frac{\epsilon_2}{\epsilon_1} (V_{4HF} + V_{4BF})^2 \quad (5')$$

which corresponds to Expression 5 is necessarily satisfied.

By way of example, one may therefore choose:

$$V_{4HF} = V_{2HF} \quad (6)$$

from which it follows (from 4') that:

$$V_{4BF} = 0 \quad (7)$$

and $$V_{1HF} = V_{2HF} \quad (8)$$

from which it follows (from 2') that:

$$V_{1BF} = 3 V_s$$

Equation 3' gives the value of $V_{2HF}$ in this particular case:

$$V_{2HF} = \frac{3}{2} \sqrt{\frac{\epsilon_1}{\epsilon_2}} V_s \qquad (10)$$

and equation 1' gives the value of $V_{3BF}$:

$$V_{3BF} = \frac{3\sqrt{5}}{2} V_s \qquad (11)$$

All the voltages are therefore determined by the equations 6 to 11; in short we have:

$$V_{1HF} = V_{2HF} = V_{4HF} = \frac{3}{2} \sqrt{\frac{\epsilon_1}{\epsilon_2}} V_s$$

$$V_{1BF} = 3 V_s$$

$$V_{3BF} = \frac{3\sqrt{5}}{2} V_s$$

$$V_{4BF} = 0$$

By way of example and in the case of the liquid crystal ZLJ 518 in which $V_s=5$ V, $\epsilon_1=0.6$ and $\epsilon_2=-0.4$, we have all the following values:

$$V_{1HF} = V_{2HF} = V_{4HF} = 9.2 \text{ V eff.}$$

$$V_{1BF} = 15 \text{ V eff.}$$

$$V_{3BF} = 16.8 \text{ V eff.}$$

$$V_{4BF} = 0$$

The advantage of this mode of excitation lies in the fact that it results in the same optical appearance in the case of all excited points and in a zero (or negative) equivalent voltage in the case of the non-excited points and therefore in a return time of reduced duration.

What we claim is:

1. A method of control for an analog display device constituted by a band of liquid crystal along which is displayed a strip having a length which is a function of the value of a physical quantity to be displayed, said strip being non-continuous and formed by S sectors each consisting of P points, each sector being such as to comprise a plate electrode connected to a sector connection and placed opposite to P point electrodes connected to a set P of point connections, said liquid crystal being interposed between the plate electrodes and the point electrodes and being capable of assuming a first optical state 1 if the electrical excitation applied between electrodes is higher than a threshold value $V_s$ and a second optical state 0 if said excitation is lower than said threshold value, a set of P voltages being applied to the P point connections of the device and a second set of S voltages being applied simultaneously to the S sector connections, said sets of voltages being such that in the case of one of the sectors designated as a boundary sector some points of the liquid crystal are in state 1 and other points are in state 0 and such that in the case of each of the other sectors the points of any one sector are all in one of the two states 1 or 0, wherein:

a voltage $V_1$ is applied to the plate connection of the boundary sector, a voltage $V_2$ is applied to the point connections which are joined to the point electrodes of the boundary sector in which a state 0 must be displayed, said voltage being such that the resultant excitation at said points is lower than the threshold value $V_s$, a voltage $-V_2'$ is applied to the point connections which are joined to the point electrodes of the boundary sector in which a state 1 must be displayed, said voltage being such that the resultant excitation at said points is higher than the threshold value, a voltage $V_3$ is applied to the plate connections of the sectors in which all the points must be in state 1, said voltage being of sufficiently high value to ensure that the two resultant excitations at the different points of said sectors are both higher than the threshold value, a voltage $V_4$ is applied to the plate connections of the sectors in which all the points must be in state 0, said voltage being of sufficiently low value to ensure that the resultant excitations are both lower than the threshold value, all the applied voltages have the same frequency.

2. A method according to claim 1, wherein the voltage $V_1$ is equal to 2 $V_s$ and the voltages $V_2$ and $V_2'$ are equal to $V_s$.

3. A method according to claim 1, wherein the voltage $V_3$ is equal to 4 $V_s$ and the voltage $V_4$ is equal to 0.

4. A method according to claim 1, wherein the applied voltages being a.c. voltages of zero mean value, the phase-shift between said voltages is so adjusted as to obtain an excitation of suitable intensity.

5. A method according to claim 1, wherein a high-frequency voltage is superimposed on the low-frequency display voltages on all the points of the device.

6. A method according to claim 1, wherein the liquid crystal employed has a so-called cut-off frequency at which the dielectric anisotropy undergoes a change of sign and wherein the voltages $V_1$, $V_2$, $V_2'$, $V_3$ and $V_4$ result from the superimposition of a.c. components of two frequencies located on each side of said cut-off frequency.

7. A method of control for an analog display device constituted by a band of liquid crystal along which is displayed a strip having a length which is a function of the value of a physical quantity to be displayed, said strip being non-continuous and formed by S sectors each consisting of P points, each sector being such as to comprise a plate electrode connected to a sector connection and placed opposite to P point electrodes connected to a set P of point connections, said liquid crystal being interposed between the plate electrodes and the point electrodes and being capable of assuming a first optical state 1 if the electrical excitation applied between electrodes is higher than a threshold value $V_s$ and a second optical state 0 if said excitation is lower than said threshold value, a set of P voltages being applied to the P point connections of the device and a second set of S voltages being applied simultaneously to the S sector connections, said sets of voltages being such that in the case of one of the sectors designated as a boundary sector some points of the liquid crystal are in state 1 and other points are in state 0 and such that in the case of each of the other sectors the points of any one sector are all in one of the two states 1 or 0, wherein:

a voltage 2 $V_s$ is applied to the plate connection of the boundary sector, a voltage $V_s$ is applied to the point connections which are joined to the point electrodes of the boundary sector in which a state 0 must be displayed, a voltage $-V_s$ is applied to the point connections which are joined to the point electrodes of the boundary sector in which a state 1 must be displayed, a voltage comprised between $3 V_s$ and $4 V_s$ is applied to the plate connections of the sectors in which all the points must be in state 1, a voltage zero is applied to the plate connections of the sectors in which all the points must be in state 0, and all the applied voltages have the same frequency.

* * * * *